United States Patent [19]

Nakasuji

[11] Patent Number: 4,684,809

[45] Date of Patent: Aug. 4, 1987

[54] METHOD OF ADJUSTING OPTICAL COLUMN IN ENERGY BEAM EXPOSURE SYSTEM

[75] Inventor: Mamoru Nakasuji, Yokohama, Japan

[73] Assignee: Kabushiki Kaisha Toshiba, Kawasaki, Japan

[21] Appl. No.: 778,243

[22] Filed: Sep. 20, 1985

[30] Foreign Application Priority Data

Sep. 29, 1984 [JP] Japan .................................. 59-204828

[51] Int. Cl.$^4$ ............................................ H01J 37/00
[52] U.S. Cl. ..................................... 250/492.2; 250/398
[58] Field of Search ............................. 250/492.2, 398; 219/121 ER, 121 ES

[56] References Cited

U.S. PATENT DOCUMENTS

| 4,413,187 | 11/1983 | Akazawa et al. | 250/492.2 |
| 4,423,305 | 12/1983 | Pfeiffer | 250/492.2 |
| 4,543,512 | 9/1985 | Nakasuji et al. | 250/492.2 |
| 4,560,878 | 12/1985 | Knauer et al. | 250/492.2 |

FOREIGN PATENT DOCUMENTS

| 53-22375 | 3/1978 | Japan . | |
| 53-49957 | 5/1978 | Japan . | |
| 60841 | 4/1982 | Japan | 250/492.2 |
| 60842 | 4/1982 | Japan | 250/492.2 |
| 79525 | 5/1984 | Japan | 250/492.2 |

OTHER PUBLICATIONS

Eiichi Goto, Takashi Soma and Masanori Idesawa, the 14th Symposium on Electron, Ion, and Photon Beam Technology, May 25, 1977.

H. C. Pfeiffer, Variable Spot Shaping for Electron-Beam Lithography, the 14th Symposium on Electron, Ion, and Photon Beam Tech.

Primary Examiner—Bruce C. Anderson
Attorney, Agent, or Firm—Oblon, Fisher, Spivak, McClelland & Maier

[57] ABSTRACT

In a method of adjusting on optical column in an electron beam exposure system, a pair of edges of a beam spot formed on a target by an electron beam is detected by rotating a first aperture mask which is located along an optical axis of an optical column. First and second blanking voltages applied to the first and second blanking deflector are adjusted so as not to completely blank the electron beam, but to minimize the detectable intensity of the beam spot. Firstly, the ration of the first voltage to the second voltage is gradually changed to shift the one pair of beam edges in a predetermined direction. The voltage ration of the voltages to be applied to the blanking deflector is determined by detecting the start of reverse shifting of the beam edges. Secondly, an excitation current supplied to a lens which projects an image of a first aperture onto a second aperture is increased to shift the other edge of the beam spot. The excitation current to be supplied to the lens is, similarly, determined by detecting the start of reverse shifting of the beam edges.

7 Claims, 3 Drawing Figures

F I G. 2
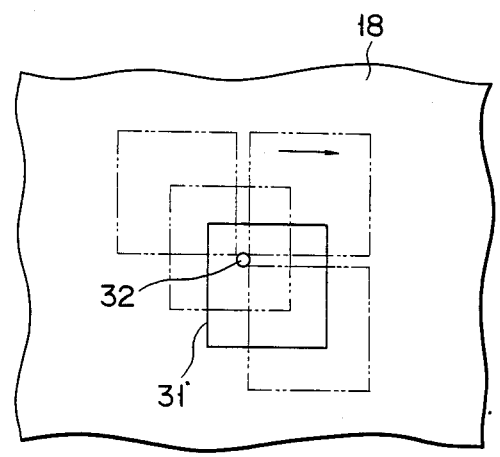
F I G. 3
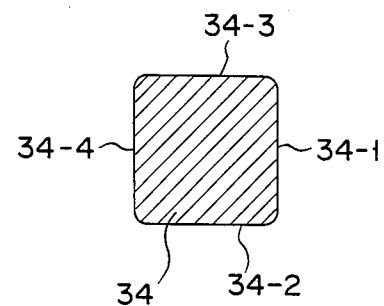

METHOD OF ADJUSTING OPTICAL COLUMN IN ENERGY BEAM EXPOSURE SYSTEM

BACKGROUND OF THE INVENTION

The present invention relates to a method of adjusting an exposure system for changing the spot shape and size of an energy beam, and, more particularly, to a method of adjusting an optical column in an energy beam exposure system.

Electron beam exposure apparatuses have been developed in a variety of applications as apparatuses for forming micropatterns on targets such as semiconductor wafers or substrates. Among these electron beam exposure apparatuses, an electron beam exposure apparatus for changing the spot shape and size of an electron beam formed on a target so as to improve the throughput of drawing has attracted a great deal of attention.

Such a conventional exposure apparatus comprises two beam aperture masks for changing spot shape and size, two beam deflectors, two blanking deflectors for blanking the beams, and a blanking plate. In this exposure apparatus, when the electron beam is blanked, the beam is deflected by the blanking deflector and intercepted by the blanking plate. During blanking, the following problems occur. The beam spot is shifted during the blanking transient period of the electron beam, and the spot shape and size of the beam change during the blanking transient period of the electron beam, thereby degrading drawing precision.

The same problems as described above occur not only in an electron beam exposure apparatus for changing the spot shape and size of the electron beam, but also in an ion beam exposure apparatus for changing the spot shape and size of the ion beam.

SUMMARY OF THE INVENTION

It is an object of the present invention to provide a method of adjusting an optical column in an energy beam exposure system, wherein a beam spot is not shifted on the target and beam spot shape and size are not changed during the blanking transient period of the energy beam, thereby improving drawing precision.

In an optical column of an energy beam exposure system, an energy beam emitted from an energy beam generating means is deflected in accordance with the magnitude of a given voltage, and blanked by a blanking means. A first aperture mask having an aperture for shaping the energy beam is illuminated by the energy beam passing through the blanking means. An image formed by the aperture of the first aperture mask is focused by a first lens means on a second aperture mask having an aperture for shaping the energy beam. The energy beam is converged by a second lens means in accordance with the magnitude of a given current. As a result, an image formed by overlaying first and second images of the first and second apertures is projected onto a target in a reduced size.

A beam deflector is arranged between the first and second aperture mask and deflects the energy beam. The superimposed image of the first and second aperture images is changed, so that the size and shape of the beam spot formed on the target are also changed. In the present invention, a change in the beam spot formed on the target upon blanking of the energy beam is detected with respect to the optical column in the target exposure system, and the magnitude of the voltage applied to the second lens means is adjusted to set a positional change of the beam spot on the target at zero.

BRIEF DESCRIPTION OF THE DRAWINGS

FIG. 2 is a plan view showing a target and an electron beam spot for scanning the surface of the target; and FIG. 3 is a plan view showing an image of an electron beam spot displayed on a CRT on the basis of a signal generated by a detector and for detecting reflected electrons in FIG. 1.

DETAILED DESCRIPTION OF THE PREFERRED EMBODIMENT

Figure 1:
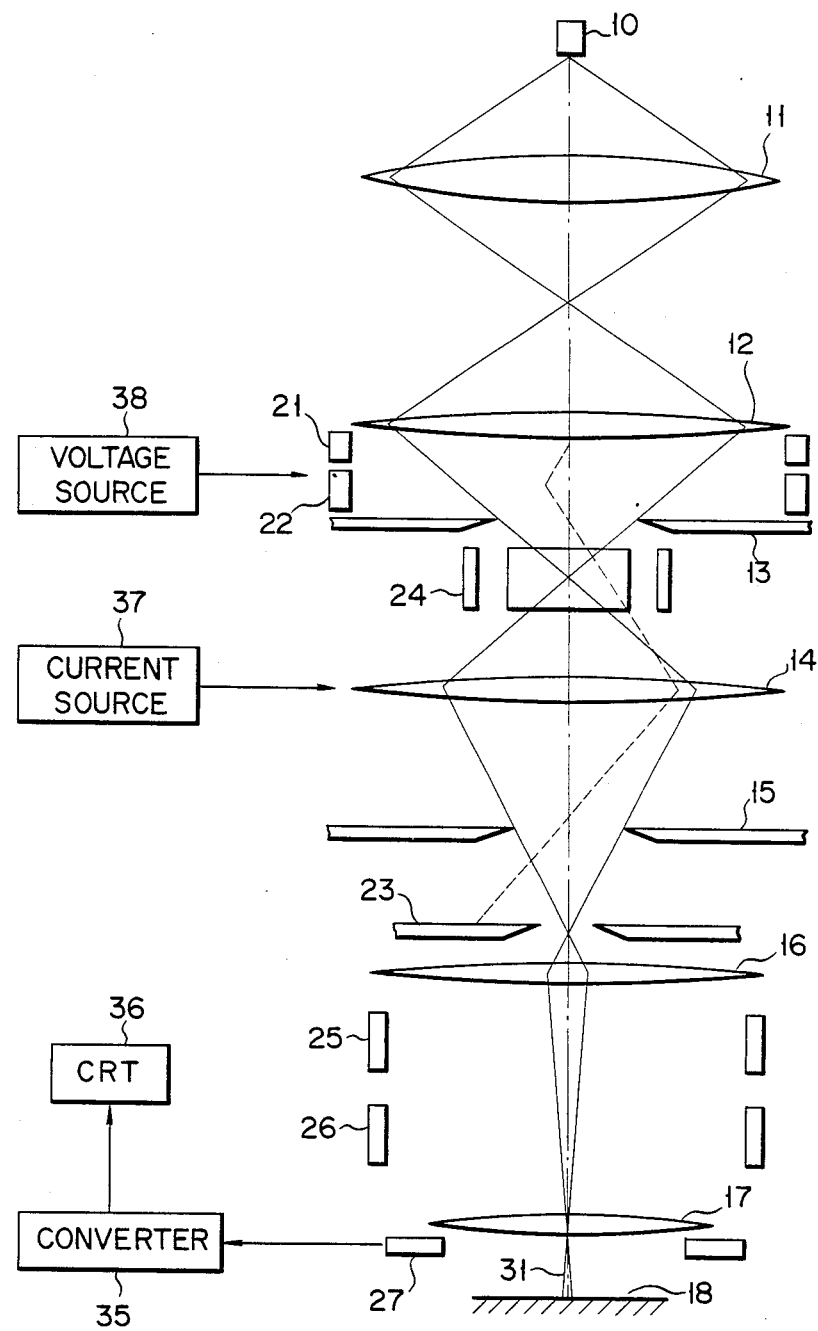
FIG. 1 is a block diagram showing an optical column in an electron beam exposure system for changing the spot shape and size of an electron beam.

A preferred embodiment of the present invention will be described with reference to the accompanying drawings. FIG. 1 is a block diagram showing an optical column in an electron beam exposure system for changing the spot shape and size of an electron beam. In this electron beam exposure system, an electron beam emitted from an electron gun 10 is converted by a first condenser lens 11 and a second condenser lens 12, and a converged beam is projected onto a first aperture mask 13. An aperture image formed by the mask 13 illuminated by the electron beam is focused on a mask 15 by a projection lens 14. An image on the mask 15 is reduced by a reduction lens 16 and an objective lens 17, and a reduced image is projected onto a target 18.

First and second blanking deflectors 21 and 22 are arranged between the lens 12 and the mask 13 to deflect the electron beams upon application of a deflection voltage from a voltage source 38. A blanking plate 23 is arranged between the mask 15 and the lens 16. When the electron beam is blanked, the electron beam is deflected by the deflectors 21 and 22, and the deflected beam is impinged on the plate 23. The electron beam propagating toward the target 18 is intercepted. A beam shaping deflector 24 is arranged between the mask 13 and the lens 14. When the shape and size of the beam spot formed on the target 18 are changed, the electron beam is deflected by the deflector 24 so that the optical overlay of the images from the masks 13 and 15 is changed. X and Y deflectors 25 and 26 are arranged between the lenses 16 and 17 to deflect electron beams in the X and Y directions, respectively. The target is scanned with the deflected electron beam. A reflection electronic sensor 27 is arranged above the target 18 to detect secondary electrons reflected by heavy metal particles such as gold particles, and to measure the intensity of the electron beam illuminated on the target 18.

A method of adjusting the optical column in the electron beam exposure apparatus described above will now be offered.

In the optical column of FIG. 1, different first and second blanking voltages are applied to the deflectors 21 and 22, so that electrical fields are produced in directions opposite to each other and perpendicular to an electron beam path. As shown in FIG. 1, the electron beam is deflected by the deflector 21 in a first deflection direction as a first deflection value. The electron beam is deflected by the deflector 22 in a second deflection direction (as a second deflection value) opposite to the first deflection direction. Therefore, by properly selecting a ratio of the first deflection voltage to the second deflection voltage, the center of the deflected electron beam during blanking can be adjusted so as to become the center of the aperture of the mask 13, and hence a positional change of the aperture image formed by the mask 13 during the blanking transient period can be decreased.

A method of aligning the deflection center of the electron beam deflected by the first and second blanking deflectors with the central position of the aperture of the mask 13 will be described hereinafter.

As shown in FIG. 2, a heavy metal particle 32 having a size sufficiently smaller than an electron beam spot 31 formed on the target 18 is placed on the target 18. The particle 32 is scanned with the electron beam spot 31, and a reflected electron beam is detected by the sensor 27. A reflected electron beam signal detected by the sensor 27 is converted by a known converter 35 in to a luminance signal. The luminance signal is supplied to a CRT (cathode-ray tube) 36 so that the image of the electron beam spot formed on the target 18, i.e., an overlaying image 34 of the apertures is displayed on the CRT 36.

Rotation of the mask 13 can be checked so as to check which of sides 34-1, 34-2, 34-3 and 34-4 of the overlaying image 34 displayed on the CRT 36 constitute the sides of the aperture of the mask 13. More specifically, when the mask 13 is slightly rotated, one pair of the sides 34-1, 34-2, 34-3 and 34-4 of the overlaying image is rotated so that these sides are contirmed that they are defined by the aperture of the mask 13. The sides 34-1 and 34-2 of the aperture image are aligned with a cursor of the CRT 36.

Thereafter, absolute values of the first and second voltages supplied from the source 38 to the deflectors 21 and 22 are increased so as not to completely blank the electron beam, but to minimize the detectable intensity of the beam spot formed on the target. The high voltages are applied to the deflectors 21 and 22. When the ratio of the absolute value of the first voltage to that of the second voltage is gradually changed, the deflection center of the electron beam during blanking is shifted along the optical axis of the optical column. The sides 34-1 and 34-2 of the aperture image 34 are shifted in a specified direction. When the ratio of the absolute value of the first voltage to that of the second voltage has reached a predetermined value, the sides 34-1 and 34-2 of the aperture image 34 are shifted in a direction opposite to the specified direction. When the blanking voltages determined at the start point of reverse shifting of the sides 34-1 and 34-2 of the aperture image 34 are applied to the deflectors 21 and 22, the deflection center of the electron beam deflected by the deflectors 21 and 22 is aligned with the central position of the aperture of the mask 13. Even during blanking, the aperture image formed by the mask 13 is not easily shifted. Therefore, blanking voltages having the voltage ratio determined at the start point of reverse shifting are thus applied to the first and second blanking deflectors.

When an image of a first aperture, i.e., a is formed on a plane including the second aperture by the projection lens 14 in a convergence condition, a positional change of the aperture image of the mask 15 during the blanking transient period can be minimized.

A method of locating the image of the first aperture in a plane including the second aperture, i.e., a method for adjusting a converging condition will be described hereinafter.

When, in the same manner as in the first aperture, the mask 15 is slightly rotated, it is confirmed that a pair of sides 34-1 and 34-2, or a pair of sides 34-3 and 34-4, e.g., the sides 34-3 and 34-4 of the aperture overlaying image 34 displayed on the CRT is defined by the aperture of the mask 15. The sides 34-3 and 34-4 of the aperture image 34 are aligned with the cursor of the CRT. Thereafter, absolute values of the first and second voltages supplied from the source 38 to the deflectors 21 and 22 are increased so as not to completely blank the electron beam, but to minimize the detectable intensity of the beam spot formed on the target. The high voltages are applied to the deflectors 21 and 22. During application of the first and second voltages, the sides 34-3 and 34-4 of the aperture image 34 are shifted. However, when an excitation current flowing from a current source 37 to the lens 14 changes, the image of the first aperture 13 is shifted along the optical axis of the optical column, so that the shift of the sides 34-3 and 34-4 of the aperture image 34 is changed.

In other words, the sides 34-3 and 34-4 of the aperture image 34 are shifted along a specific direction in accordance with the excitation current supplied from the source 37 to the lens 14. When the excitation current flowing in the lens 14 has reached a predetermined value, the sides 34-3 and 34-4 of the aperture image 34 will no longer be shifted. When the excitation current exceeds the specific value, the sides 34-3 and 34-4 of the aperture image 34 are shifted in a direction opposite to the specific direction. When the excitation current flowing in the lens 14 is set at a specific value, the sides 34-3 and 34-4 of the aperture image 34 will not be shifted even during blanking. The shift, therefore, can be minimized or brought to substantially zero. The image of the first aperture 13 is formed on the plane including the second aperture 15. Positional change of the aperture image formed by the mask 15 during the blanking transient period can be reduced so that the change in the size and the shape of the overlaying image is prevented during the transient period of the blanking operation.

In the electron beam optical column adjusted as described above, variations in beam shift and size on the target 18 during the transient period will not occur. In the electron beam exposure apparatus, degradation of drawing precision during the blanking transient period can be prevented, and drawing precision can be improved. The adjustment operation can be simplified and automated, because the adjustment operation is achieved by adjusting the beam spot shift to zero.

The present invention is not limited to the method of the embodiment described above. Various changes and modifications may be made without departing from the scope of the present invention. For example, when high-speed blanking is performed, there are times when little problem occurs even if the electron beam is slightly shifted on the target during the blanking transient period. Even in this case, when the beam size is transiently increased, pattern precision is degraded. Therefore, an excitation current is supplied to the projection lens such that the shift of the aperture image of the first aperture mask is cancelled by the shift of the aperture image of the second aperture mask.

Furthermore, the present invention is not limited to the electron beam optical column shown in FIG. 1. The present invention can also be applied to different electron beam optical columns with blanking deflectors, beam forming aperture masks and a lens arranged between the aperture masks. Furthermore, the present invention can also be applied to an ion beam optical column using an ion beam in place of an electron beam.

What is claimed is:

1. A method of adjusting an optical column in a system for exposing a target with an energy beam, said optical column comprising:
   means for emitting the energy beam toward the target;
   means for blanking the energy beam by deflecting the energy beam from said energy beam emitting means in accordance with a voltage applied thereto;
   first and second aperture masks each having an aperture for shaping the energy beam;
   first lens means for forming an aperture image of said first aperture mask on said second aperture mask;
   second lens means for reducing and then projecting an overlaying image of the aperture images of said first and second aperture masks into the target in accordance with a given current, thereby forming a beam spot corresponding to the overlaying image on the target; and
   a beam forming deflector, arranged between said first and second aperture masks, for changing an overlaying beam, thereby changing the size and shape of the beam spot formed on the target;
   comprising the steps of:
   applying no blanking voltage to said blanking means;
   detecting a position of the beam spot formed on the target;
   applying the blanking voltage to said blanking means;
   detecting another position of the beam spot on the target to obtain positional deviation of the beam spot during a transition period; and
   adjusting the given current applied to said first lens means to set the positional deviation of the beam spot on the target at substantially zero.

2. A method according to claim 1, comprising:
   determining the given current supplied to said second lens means such that the aperture images of said first and second aperture masks are shifted on the target over the same distance and in the same direction.

3. A method according to claim 1, wherein said blanking means includes a first deflector for deflecting the energy beam with a first deflection voltage in a first deflection direction and having a first deflection value, and a second deflector for deflecting the energy beam with a second deflection voltage, which has a second deflection value, in a second deflection direction which is opposite to the first deflection direction, said blanking means having a deflection center determined by a ratio of the first deflection voltage to the second deflection voltage, further comprising:
   determining the ratio of the first deflection voltage to the second deflection voltage; and
   aligning the deflection center with a center of the aperture of said first aperture mask based on the determined ratio.

4. A method according to claim 3, further including the steps of:
   detecting an edge of the beam spot on the target, 5. A method according to claim 1, wherein said system further comprises a heavy metal particle placed on the target to backscatter electrons or to generate secondary electrons upon impingement by the energy beam, comprising:
   detecting the second electrons or backscattered electrons from the heavy metal particle and generating a signal based on said detecting, and
   displaying an image of the beam spot in response to the signal generated in said detecting step.

6. A method according to claim 1, comprising:
   using an electron beam as said energy beam.

7. A method according to claim 1, comprising:
   using an ion beam as said energy beam.

* * * * *